United States Patent
Gardner et al.

[11] Patent Number: 5,877,058
[45] Date of Patent: *Mar. 2, 1999

[54] METHOD OF FORMING AN INSULATED-GATE FIELD-EFFECT TRANSISTOR WITH METAL SPACERS

[75] Inventors: Mark I. Gardner, Cedar Creek; Robert Dawson, Austin; H. Jim Fulford, Jr., Austin; Frederick N. Hause, Austin; Mark W. Michael, Cedar Park; Bradley T. Moore; Derick J. Wristers, both of Austin, all of Tex.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 703,272

[22] Filed: Aug. 26, 1996

[51] Int. Cl.$^6$ .................... H01L 21/336; H01L 21/3205
[52] U.S. Cl. ............................ 438/304; 438/596
[58] Field of Search .................. 437/44, 40 SW, 437/41 SW, 228 SW, 245, 246; 438/304, 303, 596, 595

[56] References Cited

U.S. PATENT DOCUMENTS

| | | | |
|---|---|---|---|
| 4,713,356 | 12/1987 | Hiruta | 438/297 |
| 4,745,086 | 5/1988 | Parrillo et al. | 437/57 |
| 4,962,060 | 10/1990 | Sliwa et al. | 437/192 |
| 4,963,502 | 10/1990 | Teng et al. | 437/41 SW |
| 5,182,222 | 1/1993 | Malhi et al. | 148/DIG. 126 |
| 5,217,913 | 6/1993 | Watabe et al. | 437/44 |
| 5,331,116 | 7/1994 | Haslam et al. | 174/250 |
| 5,422,289 | 6/1995 | Pierce | 437/41 SW |
| 5,460,993 | 10/1995 | Hsu et al. | 437/44 |
| 5,478,767 | 12/1995 | Hong | 438/304 |
| 5,496,751 | 3/1996 | Wei et al. | 438/302 |
| 5,518,944 | 5/1996 | Hiroki et al. | 437/41 SW |
| 5,599,726 | 2/1997 | Pan | 437/41 SW |
| 5,633,200 | 5/1997 | Hu | 437/245 |

FOREIGN PATENT DOCUMENTS 4-92436   3/1992   Japan ................ 437/40 SW

*Primary Examiner*—Michael Trinh
*Attorney, Agent, or Firm*—Skjerven, Morrill, MacPherson, Franklin & Friel LLP

[57] ABSTRACT

An IGFET with metal spacers is disclosed. The IGFET includes a gate electrode on a gate insulator on a semiconductor substrate. Sidewall insulators are adjacent to opposing vertical edges of the gate electrode, and metal spacers are formed on the substrate and adjacent to the sidewall insulators. The metal spacers are electrically isolated from the gate electrode but contact portions of the drain and the source. Preferably, the metal spacers are adjacent to edges of the gate insulator beneath the sidewall insulators. The metal spacers are formed by depositing a metal layer over the substrate then applying an anisotropic etch. In one embodiment, the metal spacers contact lightly and heavily doped drain and source regions, thereby increasing the conductivity between the heavily doped drain and source regions and the channel underlying the gate electrode. The metal spacers can also provide low resistance drain and source contacts.

37 Claims, 4 Drawing Sheets

METHOD OF FORMING AN INSULATED-GATE FIELD-EFFECT TRANSISTOR WITH METAL SPACERS

BACKGROUND OF THE INVENTION

1. Field of the Invention

The present invention relates to integrated circuits, and more particularly to insulated-gate field-effect transistors.

2. Description of Related Art

An insulated-gate field-effect transistor (IGFET), such as a metal-oxide semiconductor field-effect transistor (MOSFET), uses a gate electrode to control an underlying surface channel joining a drain and a source. The channel, drain and source are located in a semiconductor substrate, with the substrate being doped oppositely to the drain and source. The gate electrode is separated from the semiconductor substrate by a thin insulating layer such as a gate oxide. The operation of the IGFET involves application of an input voltage to the gate electrode, which sets up a transverse electric field in the channel in order to modulate the longitudinal conductance of the channel.

In typical IGFET processing, the source and drain are formed by introducing dopants of a second conductivity type (P or N) into the semiconductor substrate of a first conductivity type (N or P) using a patterned gate electrode as a mask. This self-aligning procedure tends to improve packing density and reduce parasitic overlap capacitances between the gate electrode and the source/drain regions.

Polysilicon (also called polycrystalline silicon, poly-Si or poly) thin films have many important uses in IGFET technology. One of the key innovations is the use of heavily doped polysilicon as the gate electrode in place of aluminum. Since polysilicon has the same high melting point as a silicon substrate, it can be deposited prior to source and drain formation, and serve as a mask during formation of the source and drain regions by ion implantation. The resistance of polysilicon can be further reduced by forming a silicide on its top surface.

As IGFET dimensions are reduced and the supply voltage remains constant (e.g., 3 V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate electrode, and a heavy implant is self-aligned to the gate electrode on which sidewall spacers have been formed. The spacers are typically oxides or nitrides. The purpose of the lighter first dose is to form a lightly doped region of the drain (or LDD) at the edge near the channel. The second heavier dose forms a low resistivity region of the drain, which is subsequently merged with the lightly doped region. Thereafter, electrical contacts are formed on the heavily doped region. Since the heavily doped region is farther away from the channel than a conventional drain structure, the depth of the heavily doped region can be made somewhat greater without adversely affecting the device characteristics. The lightly doped region is not necessary for the source (unless bidirectional current is used), however LDD structures are typically formed for both the drain and source to avoid the need for an additional masking step.

Disadvantages of LDDs are their increased fabrication complexity compared to conventional drain structures, and parasitic resistance. LDDs exhibit relatively high parasitic resistance due to their light doping levels. During operation, the LDD parasitic resistance can decrease drain current, which in turn may reduce the speed of the IGFET.

Accordingly, there is a need for an IGFET which reduces the parasitic resistance associated with LDDs, and which provides an efficient manner of providing drain and source contacts.

SUMMARY OF THE INVENTION

The present invention provides an IGFET transistor with metal spacers disposed on the drain and source and electrically isolated from the gate electrode. A key feature of the invention is formation of the metal spacers by depositing a blanket layer of conductive metal and then applying an anisotropic etch.

Accordingly, an object of the present invention is to provide metal spacers that can be used as drain and source contacts. Another object of the invention is to provide metal spacers that can increase the lateral conductivity of lightly doped regions, thereby significantly reducing the resistance between heavily doped regions and the channel.

According to one aspect of the invention, an IGFET includes a gate insulator on a semiconductor substrate, a gate electrode on the gate insulator, sidewall insulators adjacent to opposing edges of the gate electrode, metal spacers adjacent to the sidewall insulators and electrically isolated from the gate electrode, and a drain and source in the substrate that contact the metal spacers. If desired, the metal spacers can contact lightly and heavily doped drain and source regions. In this manner, the metal spacers increase the lateral conductivity of the lightly doped regions, and provide drain and source contacts electrically coupled to the heavily doped regions. The sidewall insulators can be oxide spacers that extend to the substrate and cover opposing edges of the gate insulator. Alternatively, the sidewall insulators can be oxides or nitrides grown or deposited on the edges of the gate electrode and vertically spaced from the substrate, so that the metal spacers contact portions of the drain and source underlying the sidewall insulators. Preferably, the gate electrode is polysilicon, the metal spacers are a highly conductive metal such as aluminum, tungsten, titanium, cobalt, or combinations thereof, and the sidewall insulators are sufficiently thick to prevent the metal spacers from diffusing into the gate electrode.

Another aspect of the invention is a method of forming an IGFET with a metal spacers, comprising the steps of forming a gate insulator on a semiconductor substrate, forming a gate electrode on the gate insulator, forming sidewall insulators adjacent to opposing edges of the gate electrode, forming a drain and source in the substrate, and then forming metal spacers on the substrate and adjacent to the sidewall insulators such that the metal spacers contact portions of the drain and source and are electrically isolated from the gate electrode. In this manner, the metal spacers are formed after a high temperature anneal activates the drain and source A first embodiment of the method includes implanting lightly doped drain and source regions using the gate electrode as an implant mask, forming sidewall insulators adjacent to edges of the gate electrode, implanting heavily doped drain and source regions using the sidewall insulators and gate electrode as an implant mask, applying a thermal cycle to drive-in and activate the drain and source, and then forming the metal spacers.

A second embodiment of the method includes implanting heavily doped drain and source regions using the gate electrode as an implant mask, forming the sidewall insulators adjacent to edges of the gate electrode, applying a thermal cycle to drive-in and activate the drain and source, and then forming the metal spacers.

A third embodiment of the method includes forming insulative spacers adjacent to edges of the gate electrode, implanting heavily doped drain and source regions using the insulative spacers and gate electrode as an implant mask, applying a thermal cycle to drive-in and activate the drain and source, and then forming the metal spacers.

An advantage of the invention is that the metal spacers are formed directly on underlying portions of the drain and source, and therefore provide low resistance drain and source contacts. Moreover, if the metal spacers contact both lightly and heavily doped drain and source regions, then the metal spacers reduce the resistance between the heavily doped drain and source regions and the channel underlying the gate electrode.

These and other objects, features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
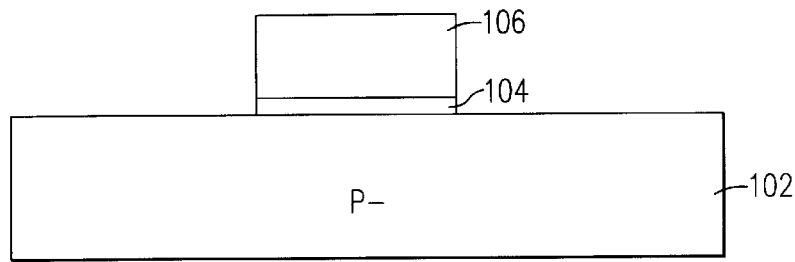
FIGS. 1A–1F show cross-sectional views of successive process steps for forming an IGFET with metal spacers in accordance with a first embodiment of the invention.

In the drawings, depicted elements are not necessarily drawn to scale and like or similar elements may be designated by the same reference numeral throughout the several views.

FIGS. 1A–1F show cross-sectional views of successive process steps for forming an IGFET with metal spacers in accordance with a first embodiment of the invention.

In FIG. 1A, a gate electrode is disposed on a gate insulator, which in turn is disposed on a semiconductor substrate suitable for integrated circuit manufacture. For instance, substrate 102 includes a P-type planar epitaxial surface layer with a <100> orientation and a resistivity of 12 ohm-cm. Preferably, the epitaxial surface layer is disposed on a P+ base layer (not shown). A blanket layer of gate oxide 104 (such as $SiO_2$) is formed on the top surface of substrate 102 using tube growth at a temperature of 700° to 1000° C. in an $O_2$ containing ambient. Gate oxide 104 has a thickness in the range of 30 to 200 angstroms. Thereafter, a blanket layer of polysilicon 106 is deposited by low pressure chemical vapor deposition (LPCVD) on the top surface of gate oxide 104. Polysilicon 106 has a thickness in the range of 250 to 4000 angstroms. Polysilicon 106 is doped by ion implantation of arsenic at a dose in the range of $1 \times 10^{15}$ to $5 \times 10^{15}$ atoms/cm$^2$ and an energy in the range of 2 to 80 kiloelectron-volts. Alternatively, if desired, polysilicon 106 can be doped by a subsequent source/drain implant.

Thereafter, polysilicon 106 and gate oxide 104 are patterned using photolithography and an anisotropic etch. For submicron dimensions, patterning a photoresist mask (not shown) by I-line photolithography using a mercury vapor lamp is preferred. After the photoresist mask is patterned, an anisotropic etch is applied, polysilicon 106 is etched back to provide a non-floating gate electrode, and gate oxide 104 is etched back to provide a gate insulator. Preferably, a first etchant is applied that is highly selective of polysilicon, then a second etchant is applied that is highly selective of oxides. After etching occurs, polysilicon 106 includes opposing vertical edges, the underlying gate oxide 104 also includes opposing vertical edges, and the edges of polysilicon 106 and gate oxide 104 are substantially laterally aligned. Polysilicon 106 and gate oxide 104 have a length of about 0.4 to 0.5 microns. Portions of substrate 102 outside the edges of polysilicon 106 are exposed and substantially unaffected by the etch. Therefore, the top surface of substrate 102 outside polysilicon 106 is coplanar with the portion of substrate 102 underlying polysilicon 106.

Figure 1B:
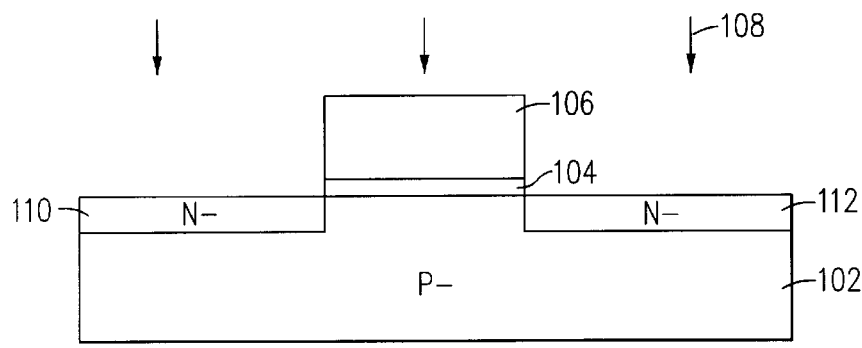

In FIG. 1B, lightly doped drain and source regions are implanted using the gate electrode as an implant mask. For instance, the structure is subjected to ion implantation of arsenic, as indicated by arrows 108, at a dose in the range of $1 \times 10^{13}$ to $5 \times 10^{14}$ atoms/cm$^2$ and an energy in the range of 2 to 80 kiloelectron-volts. As a result, lightly doped drain and source regions 110 and 112 are formed in substrate 102 outside polysilicon 106. Lightly doped drain and source regions 110 and 112 are doped N- with a dopant concentration in the range of about $1 \times 10^{17}$ to $1 \times 10^{18}$ atoms/cm$^3$ and a depth in the range of 0.01 to 0.15 microns. The junctions are substantially laterally aligned with the edges of polysilicon 106.

Figure 1C:
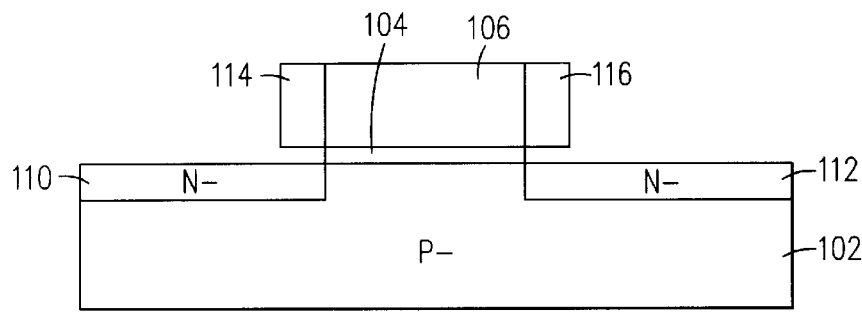

In FIG. 1C, sidewall insulators are formed on the edges of the gate electrode. For instance, a layer of oxide (such as $SiO_2$) is formed on the exposed silicon surfaces using a rapid thermal anneal in an oxidizing ambient. The oxidation rate of polysilicon is greater that the oxidation rate of single crystal silicon, particularly if the polysilicon is doped with arsenic. Therefore, the oxide grown on substrate 102 can be removed using a single dip in a wet chemical etchant. Furthermore, the oxide grown on the top surface of polysilicon 106 can also be removed using conventional techniques, such as a second dip in a wet chemical etchant. As a result, thin sidewall oxides 114 and 116 cover the edges of polysilicon 106. Sidewall oxides 114 and 116 each extend a lateral distance in the range of 200 to 1000 angstroms, have about the same height as polysilicon 106, and are vertically spaced from substrate 102. In addition, portions of lightly doped drain and source regions 110 and 112 beneath sidewall oxides 114 and 116, respectively, are exposed, and the edges of gate oxide 104 are exposed.

Figure 1D:
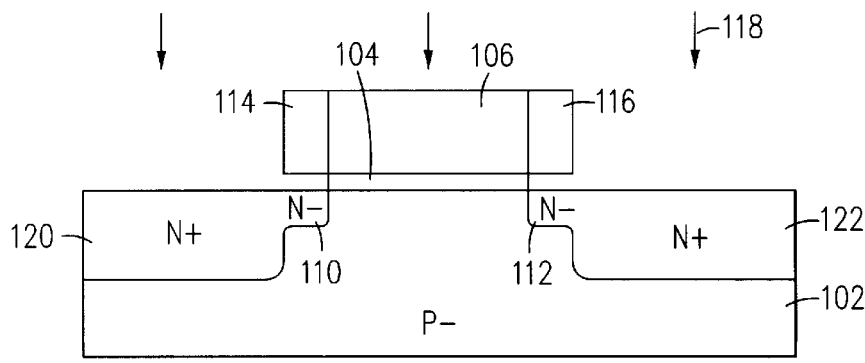

In FIG. 1D, heavily doped drain and source regions are formed in the substrate using the sidewall insulators and gate electrode as an implant mask. For instance, the structure is subjected to ion implantation of arsenic, as indicated by arrows 118, at a dosage of $1 \times 10^{15}$ to $5 \times 10^{15}$ atoms/cm$^2$ and an energy in the range of 2 to 80 kiloelectron-volts. As a result, heavily doped drain and source regions 120 and 122 are doped N+ with an arsenic concentration in the range of $1 \times 10^{18}$ to $1 \times 10^{19}$ atoms/cm$^3$ and a depth in the range of 0.02 to 0.3 microns. Preferably, heavily doped drain and source regions 120 and 122 are implanted with a substantially greater energy, and therefore have a substantially greater depth than lightly doped drain and source regions 110 and 112.

Figure 1E:
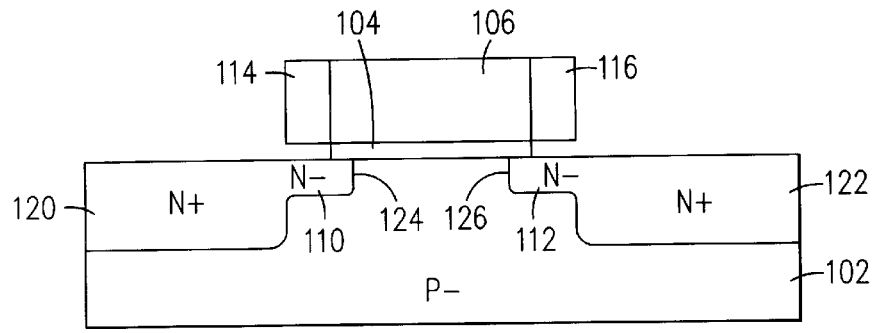

In FIG. 1E, the implanted dopants are diffused into the substrate. For instance, an anneal (or drive-in) step is performed to activate the implanted arsenic dopants by applying a rapid thermal anneal on the order of 950° to 1050° C. for 10 to 30 seconds. In this manner, regions 110 and 120 are activated and merge to form a drain (in which region 110 provides an LDD), and regions 112 and 122 are activated and merge to form a source. Since heavily doped drain and source regions 120 and 122 have a far higher impurity concentration than lightly doped drain and source regions 110 and 112, heavily doped drain and source regions 120 and 122 diffuse farther into substrate 102. After diffusion occurs, lightly doped drain and source regions 110 and 112 include channel junctions 124 and 126, respectively, that remain substantially laterally aligned to the edges of polysilicon 106.

Figure 1F:
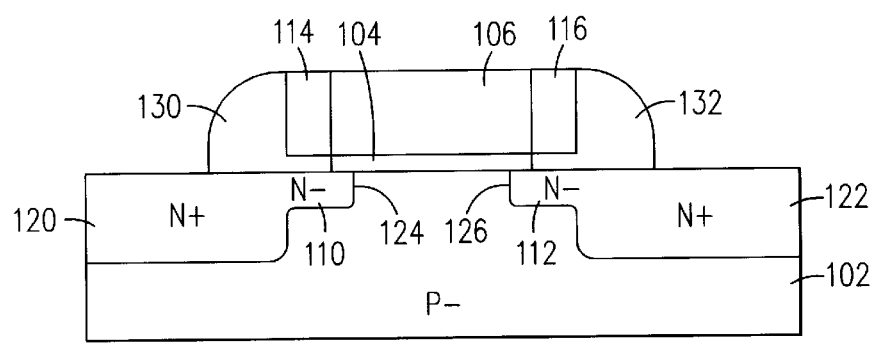

In FIG. 1F, metal spacers are formed on the substrate and adjacent to the sidewall insulators. For instance, a brief wet chemical etch is applied to remove native oxide from the top surface of substrate 102, a blanket layer of conductive metal is sputtered over substrate 102, and then an anisotropic etch provided by a reactive ion etch is applied to the conductive metal layer to form metal spacers 130 and 132. Preferred metals for the metal spacers include aluminum, titanium, tungsten, cobalt, and combinations thereof. Titanium and cobalt are especially preferred due to their relatively high melting points. Metal spacers 130 and 132 contact lightly doped regions 110 and 112, respectively, heavily doped drain and source regions 120 and 122, respectively, as well as sidewall oxides 114 and 116, respectively. Metal spacers 130 and 132 also contact the edges of gate oxide 104, and portions of lightly doped drain and source regions 110 and 112, respectively, beneath sidewall oxides 114 and 116, respectively. However, metal spacers 130 and 132 do not contact polysilicon 106. Instead, metal spacers 130 and 132 are spaced from and electrically isolated from polysilicon 106. Furthermore, sidewall oxides 114 and 116 have sufficient length to prevent metal spacers 130 and 132 from diffusing into polysilicon 106. The height of metal spacers 130 and 132 is substantially the same as the combined heights of gate oxide 104 and polysilicon 106. The length of metal spacers 130 and 132 along substrate 106 is in the range of 0.01 to 0.15 microns. As a result, metal spacers. 130 and 132 are electrically coupled to inner portions of heavily doped drain and source regions 120 and 122, respectively, and provide drain and source contacts, respectively although metal spacers 130 and 132 do not contact outer portions of heavily doped drain and source regions 120 and 122, respectively, which are exposed. Moreover, metal spacers 130 and 132 increase the lateral conductivity of lightly doped drain and source regions 110 and 112, respectively. Accordingly, lightly doped drain and source regions 110 and 112 form junctions with substrate 102 that define the channel length of an N-channel MOSFET controlled by polysilicon 106, and metal spacers 130 and 132 lower the resistance between heavily doped drain and source regions 120 and 122, respectively, and the channel. Advantageously, since the high temperature drive-in step has already been performed, the metal spacers need not be melted.

FIGS. 2A–2E show cross-sectional views of successive process steps for forming an IGFET with metal spacers in accordance with a second embodiment of the invention. The advantages of LDDs have been described above. However, LDDs typically require two implant steps and increase the parasitic resistance. Therefore, in some instances, it is preferable to omit the LDDs. Furthermore, it is often desirable to minimize the lateral overlap between the gate electrode and the source/drain, since reducing overlap capacitance improves switching speeds. However, decreasing the channel length increases drive current. Thus, the overlap between the gate electrode and source/drain involves a tradeoff between switching speed and drive current. In some instances, the drive current is more important.

A primary difference between the second embodiment and the first embodiment is that in the second embodiment, the drain and source are implanted in a single implant step by subjecting the structure to a heavy dose of arsenic using the gate electrode as an implant mask. As a result, the LDD is omitted, and the lateral overlap between the gate electrode and the drain/source is increased. Unless otherwise noted, the elements for the second embodiment (e.g., substrate 202, gate oxide 204, etc.) are similar to elements of the first embodiment (e.g., substrate 102, gate oxide 104, etc.), and the description of related elements and process steps need not be repeated.

Figure 2A:
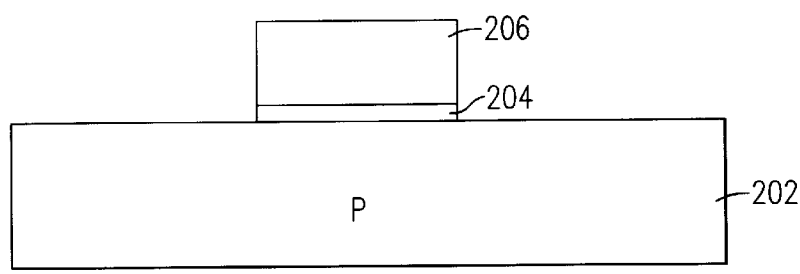
FIGS. 2A–2E show cross-sectional views of successive process steps for forming an IGFET with metal spacers in accordance with a second embodiment of the invention.

In FIG. 2A, gate oxide 204 is formed on substrate 202, and polysilicon 206 is formed on gate oxide 204.

Figure 2B:
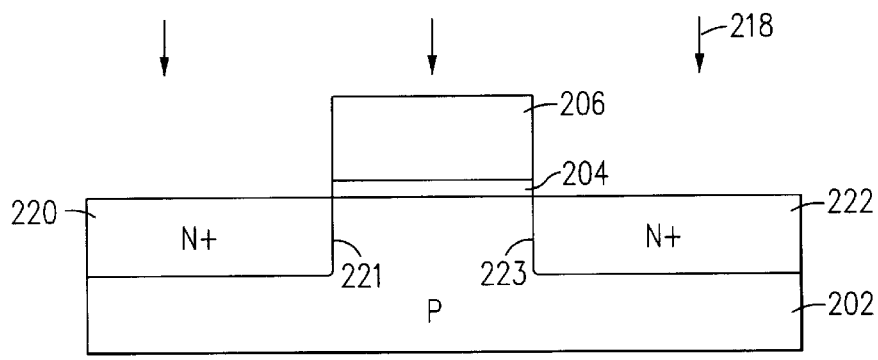

In FIG. 2B, the drain and source are implanted into the substrate using the gate electrode as an implant mask. For instance, the structure is subjected to ion implantation of arsenic at a dose in the range of $1 \times 10^{15}$ to $5 \times 10^{15}$ atoms/cm$^2$ and an energy in the range of 2 to 80 kiloelectron-volts. As a result, heavily doped drain region 220 and heavily doped source region 222 are formed in substrate 202 outside polysilicon 206. Heavily doped drain and source regions 220 and 222 are doped N+ with a dopant concentration in the range of about $1 \times 10^{18}$ to $1 \times 10^{19}$ atoms/cm$^3$ and a junction depth in the range of 0.02 to 0.3 microns. Heavily doped drain and source regions 220 and 222 include channel junctions 221 and 223, respectively, that are substantially laterally aligned with the edges of polysilicon 206.

Figure 2C:
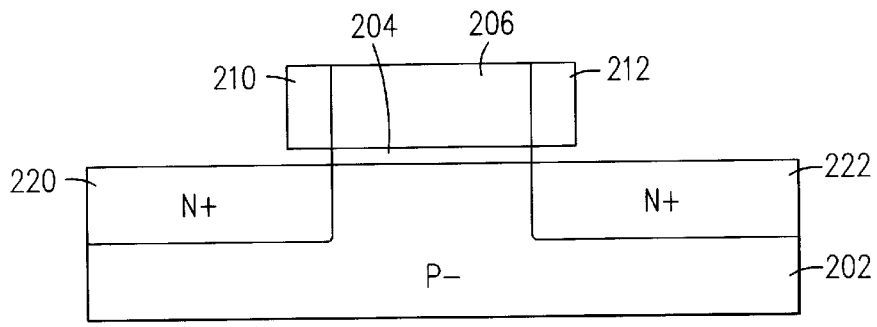

In FIG. 2C, sidewall oxides 210 and 212 are formed on the opposing edges of polysilicon 206 and spaced from substrate 202.

Figure 2D:
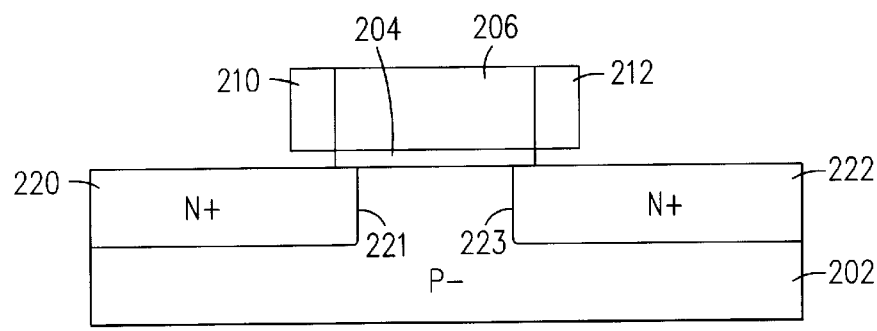

In FIG. 2D, the implanted arsenic is diffused into the substrate using the drive-in step. Since heavily doped drain and source regions 220 and 222 have a far higher impurity concentration than lightly doped regions 110 and 112, heavily doped drain and source regions 220 and 222 diffuse farther into substrate 202 that lightly doped drain and source regions 110 and 112 diffuse into substrate 102. After diffusion occurs, a significant lateral overlap exists between junction 221 and polysilicon 206, as well as between junction 223 and polysilicon 206.

Figure 2E:
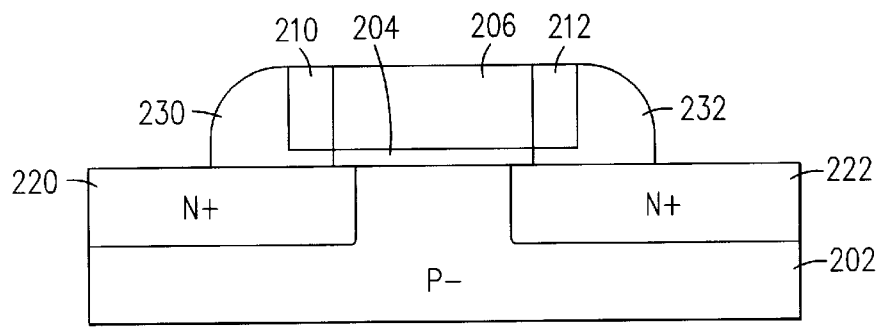

In FIG. 2E metal spacers 230 and 232 are formed. Metal spacers 230 and 232 are electrically coupled to heavily doped drain and source regions 220 and 222, respectively, and provide drain and source contacts, respectively.

FIGS. 3A–3E show cross-sectional views of successive process steps for forming an IGFET with metal spacers in accordance with a third embodiment of the invention. The present invention is well-suited for forming P-channel MOSFETs as well as N-channel MOSFETs. Boron is a commonly used P-type dopant. Unfortunately, boron tends to diffuse much faster than typical N-type dopants such as arsenic and phosphorus. As mentioned above, diffusing the drain and source beneath the gate electrode may result in overlap capacitance leading to reduced switching speeds. If a significant lateral diffusion is expected, and reducing overlap capacitance is of importance, then it may be desirable to laterally space the implanted dopant from the gate electrode in order to offset the anticipated lateral diffusion. Accordingly, when boron is the dopant, it may be especially important to laterally offset the implanted boron from the desired location of the junction.

The primary difference between the third embodiment and the first embodiment is that in the third embodiment, an N-type substrate is used, the drain and source are implanted in a single implant step by subjecting the structure to a heavy dose of boron using sidewall insulators and the gate electrode as an implant mask, thereby laterally offsetting the implanted drain and source regions from the gate electrode. In addition, the sidewall insulators extend to the surface of the substrate. Unless otherwise noted, the elements for the third embodiment (e.g., substrate 302, gate oxide 304, etc.) are similar to elements of the first embodiment (e.g., substrate 102, gate oxide 104, etc.), and the description of related elements and process steps need not be repeated.

Figure 3A:
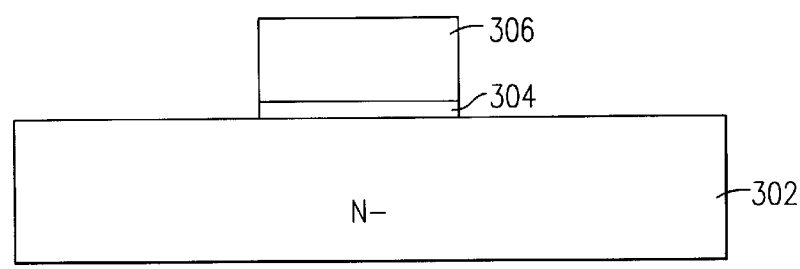
FIGS. 3A–3E show cross-sectional views of successive process steps for forming an IGFET with metal spacers in accordance with a third embodiment of the invention.

In FIG. 3A, gate oxide 304 is formed on substrate 302, and polysilicon 306 is formed on gate oxide 304. Substrate 302 is similar to substrate 102, except substrate 302 is doped N-type.

Figure 3B:
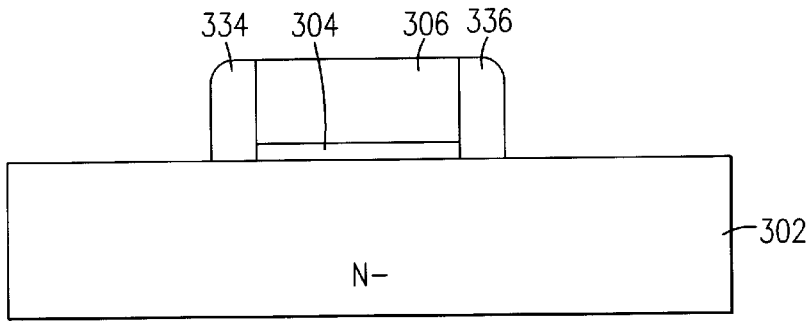

In FIG. 3B, sidewall insulators are formed adjacent to the gate electrode. In this instance, a thick layer of oxide (such as $SiO_2$) is formed over substrate 302, and then an anisotropic etch provided by a reactive ion etch is applied to form oxide spacers 334 and 336 adjacent to polysilicon 306. Oxide spacers 334 and 336 contact substrate 302, extend a lateral distance in the range of 200 to 1000 angstroms along substrate 302, cover the edges of gate oxide 304, and have essentially the same height as polysilicon 306 and gate oxide 304 combined. To ensure a high quality interface under oxide spacers 334 and 336, it may be desirable to form a thin oxide layer (not shown) between the oxide spacers and substrate 302, provided the thin oxide layer is removed where the metal spacers shall be deposited.

Figure 3C:
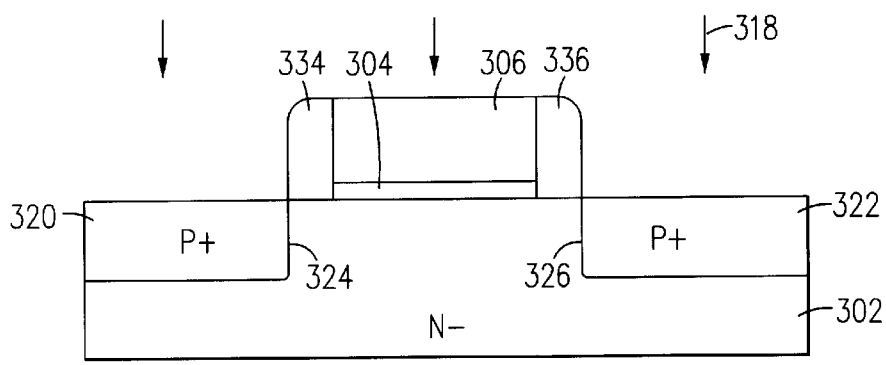

In FIG. 3C, the drain and source are implanted into the substrate using the sidewall insulators and gate electrode as an implant mask. For instance, the structure is subjected to ion implantation of boron, as indicated by arrows 338, at a dose in the range of $1 \times 10^{15}$ to $5 \times 10^{15}$ atoms/cm$^2$ and an energy in the range of 2 to 80 kiloelectron-volts. As a result, heavily doped drain and source regions 320 and 322 are doped P+ and formed in substrate 302 outside oxide spacers 334 and 336, respectively. Heavily doped drain and source regions 320 and 322 include junctions 324 and 326, respectively, that are substantially laterally aligned with the outer edges of oxide spacers 334 and 336, respectively.

Figure 3D:
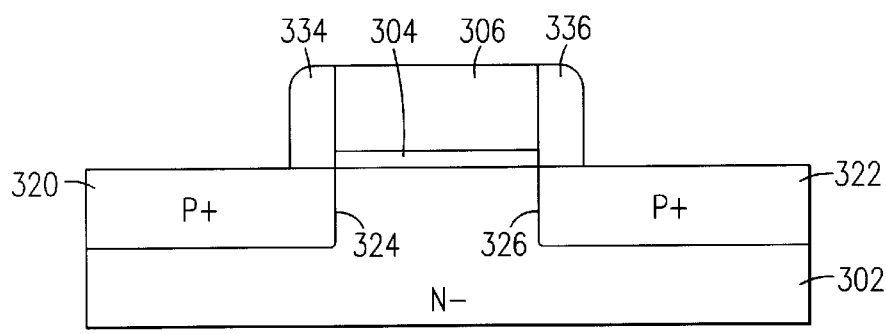

In FIG. 3D, the implanted dopants are diffused into the substrate using a drive-in step. The drive-in step for boron typically requires less heat than for N-type dopants such as arsenic. For instance, the drive-in for boron is a rapid thermal anneal in the range of 800° to 1000° C. for 10 to 30 seconds. Since heavily doped drain and source regions 320 and 322 have a far higher dopant concentration and more rapidly diffusing dopant than lightly doped drain and source regions 110 and 112, heavily doped drain and source regions 320 and 322 diffuse much farther into substrate 302 than lightly doped drain and source regions 110 and 112 diffuse into substrate 102. Heavily doped drain and source regions 320 and 322 diffuse beneath oxide spacers 334 and 336, respectively, such that junctions 324 and 326 are substantially laterally aligned with the edges of polysilicon 306.

Figure 3E:
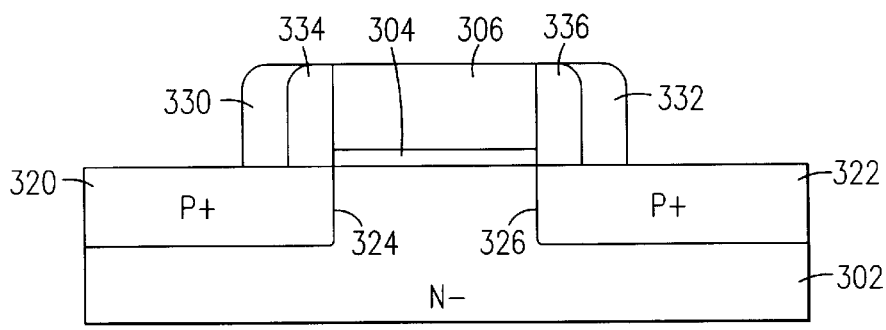

In FIG. 3E, metal spacers 330 and 332 are formed. Since oxide spacers 334 and 336 extend to substrate 302 and cover the edges of gate oxide 304, metal spacers 330 and 332 do not contact portions of substrate 302 beneath oxide spacers 334 and 336 and do not contact the edges of gate oxide 304. However, metal spacers 330 and 332 do contact the sides of oxide spacers 334 and 336, respectively, are electrically isolated from polysilicon 306, and are electrically coupled to heavily doped drain and source regions 320 and 322, respectively, to provide drain and source contacts, respectively.

Further processing steps in the fabrication of IGFETs typically include forming a thick oxide layer over the active regions, forming contact windows in the oxide layer to expose the drain, source and gate electrode, forming appropriate interconnect metallization in the contact windows, and forming a passivation layer. A salicide process can be used in conjunction with the metal spacers. In addition, subsequent high temperature process steps can be used to supplement or replace the drive-in step to provide the desired anneal, activation, and drive-in functions. These further processing steps are conventional and need not be repeated herein. Likewise the principal processing steps disclosed herein may be combined with other steps readily apparent to those skilled in the art.

At completion of the process, it is preferred that the junctions be precisely controlled. However, to the extent that the lateral locations of the drain and source are not (or can not be) precisely controlled, it is far preferable to have a slight overlap between drain and source and the gate electrode as opposed to a lateral displacement or gap. While a slight overlap will lead to capacitive effects, a lateral displacement or gap may prevent the formation of a conductive channel between the drain and source during device operation.

It is highly desirable to avoid melting the metal spacers since melting the metal spacers may cause spiking into the substrate. If an implant mask is needed at the locations where the metal spacers shall be formed, then disposable spacers capable of withstanding the high temperature anneal can be used, and then the metal spacers can replace the disposable spacers. For instance, disposable nitride spacers can be formed adjacent to sidewall oxides and later stripped without removing the sidewall oxides. Alternatively, the sidewall insulators can extend into the locations where the metal spacers shall be formed, and then be partially etched back to expose these locations without exposing the edges of the gate electrode. For instance, oversized oxide spacers can be formed adjacent to the edges of the gate electrode, and then be partially etched back by applying another anisotropic etch. As yet another alternative, the sidewall insulators can be formed after forming the drain and source, which may include implanting the drain and source and then removing a material located where the sidewall insulators and metal spacers shall be.

The present invention includes numerous variations to the embodiments described above. For instance, the gate electrode can be a conductor such as a metal, the gate insulator and the sidewall insulators can be various dielectrics such as silicon dioxide and silicon nitride, and the metal spacers can be various conductive metals. The sidewall insulators can be formed using deposition, tube growth and rapid thermal anneal growth. A polysilicon gate electrode can be deposited doped or undoped, and if deposited undoped can be doped at various stages of the process. N-type or P-type dopants can be used in any of the embodiments described above, and the dopants can be activated by applying various combinations of heat and pressure. Suitable N-type dopants include arsenic and phosphorus; suitable P-type dopants include boron $B_{10}$ and boron $B_{11}$, and $BF_x$ species such as $BF_2$. The metal spacers can replace disposable spacers having different configurations and/or compositions. If, for instance, aluminum spacers are desired, the aluminum spacers can replace insulative spacers after the high temperature steps are completed. Moreover, metal spacers for different devices on a substrate need not be identical. For instance, in CMOS circuits, the metal spaces can be tailored differently for N-channel and P-channel devices. Finally, it is not essential that the metal spacers provide contacts for the drain and source. For instance, the metal spacers can be used merely to increase the conductivity between heavily doped drain and source regions and the channel, and separate drain and source contacts can be formed over the heavily doped drain and source regions.

The invention is particularly well-suited for fabricating N-channel MOSFETs, P-channel MOSFETs, and other types of IGFETs, particularly for high-performance microprocessors where high circuit density is essential. Although only a single FET has been shown for purposes of illustration, it is understood that in actual practice, many devices are fabricated on a single semiconductor wafer as widely practiced in the art. Accordingly, the invention is well-suited for use in integrated an circuit chip, as well as an electronic system including a microprocessor, a memory, and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of forming an IGFET with metal spacers, comprising the steps of:
    forming a gate insulator on a semiconductor substrate;
    forming a non-floating gate electrode on the gate insulator;
    completely forming a drain and a source in the substrate;
    forming sidewall insulators adjacent to opposing edges of the gate electrode; and then
    depositing a conductive metal layer over the substrate and applying an anisotropic etch to the conductive metal layer to form metal spacers on the substrate and adjacent to the sidewall insulators, wherein the metal spacers contact first portions of the drain and the source and are electrically isolated from the gate electrode, and second portions of the drain and the source outside the metal spacers are exposed.

2. The method of claim 1, wherein the metal spacers have heights that are substantially the same as combined heights of the gate electrode and the gate insulator.

3. The method of claim 1, wherein forming the drain and the source includes implanting dopants into the substrate and then applying a high temperature anneal to drive-in and activate the dopants.

4. The method of claim 1, including implanting the drain and the source into the substrate using the gate electrode as an implant mask before forming the sidewall insulators.

5. The method of claim 1, including implanting the drain and the source into the substrate using the gate electrode and the sidewall insulators as an implant mask.

6. The method of claim 1, wherein forming the drain and the source includes implanting heavily doped drain and source regions using the gate electrode and the sidewall insulators as an implant mask, and the metal spacers contact the heavily doped drain and source regions.

7. The method of claim 6, wherein forming the drain and the source includes implanting lightly doped drain and source regions using the gate electrode as an implant mask, the sidewall insulators are vertically spaced from the substrate, and the metal spacers contact the lightly doped and heavily doped drain and source regions to increase a lateral conductivity across the lightly doped drain and source regions thereby decreasing a resistance between the heavily doped drain and source regions and a channel in the substrate underlying the gate electrode.

8. The method of claim 6, including etching a portion of the sidewall insulators after implanting the heavily doped drain and source regions.

9. The method of claim 1, wherein the sidewall insulators extend to the substrate and cover opposing edges of the gate insulator.

10. The method of claim 1, wherein the sidewall insulators are vertically spaced from the substrate, and the metal spacers contact portions of the drain and source underlying the sidewall insulators.

11. The method of claim 10, wherein the metal spacers contact opposing edges of the gate insulator.

12. The method of claim 1, including forming the drain and the source before forming the sidewall insulators.

13. The method of claim 1, including forming the drain and the source after forming the sidewall insulators.

14. The method of claim 1, further comprising forming disposable spacers on the substrate and adjacent to the sidewall insulators, implanting regions of the drain and the source using the disposable spacers, the sidewall insulators and the gate electrode as an implant mask, removing the disposable spacers, and then forming the metal spacers.

15. A method of forming an IGFET with metal spacers, comprising the following steps in the sequence set forth:
    forming a gate insulator on a semiconductor substrate;
    forming a non-floating gate electrode with first and second opposing vertical edges on the gate insulator;
    implanting lightly doped drain and source regions in the substrate using the gate electrode as a mask;
    forming first and second sidewall insulators on the first and second edges, respectively, of the gate electrode, wherein the sidewall insulators are vertically spaced from the substrate;
    implanting heavily doped drain and source regions using the first and second sidewall insulators and the gate electrode as an implant mask;
    applying a high temperature anneal to drive-in and activate the lightly doped and heavily doped drain and source regions, thereby completely forming a drain and a source;
    depositing a blanket layer of a conductive metal over the substrate; and
    applying an anisotropic etch to the blanket layer of conductive metal to form first and second metal spacers adjacent to the first and second sidewall insulators, respectively, and on the drain and the source, respectively, wherein the first and second metal spacers are spaced from and electrically isolated from the gate electrode, the first and second metal spacers are in contact with and electrically coupled to first portions of the heavily doped drain and source regions, respectively, and second portions of the heavily doped drain and source regions outside the metal spacers are exposed.

16. The method of claim 15, wherein the first and second metal spacers are in contact with and electrically coupled to the lightly doped drain and source regions, respectively.

17. The method of claim 16, wherein the first and second metal spacers contact the lightly doped drain and source regions, respectively, beneath the first and second sidewall insulators, respectively.

18. The method of claim 16, wherein the first metal spacer increases a lateral conductivity of the lightly doped drain region and provides a low resistance contact to the heavily doped drain region, and the second metal spacer increases a lateral conductivity of the lightly doped source region and provides a low resistance contact to the heavily doped source region.

19. The method of claim 15, wherein the gate electrode is polysilicon, the gate insulator is silicon dioxide, the sidewall insulators are selected from the group consisting of silicon dioxide and silicon nitride, and the metal spacers are selected from the group consisting of aluminum, titanium, tungsten, cobalt, and combinations thereof.

20. A method of forming a MOSFET with metal spacers, comprising the steps of:
forming a gate oxide on a semiconductor substrate of first conductivity type;
forming a non-floating polysilicon gate electrode on the gate oxide;
implanting a dopant of second conductivity type into the substrate and applying a high temperature anneal to drive-in and activate the second dopant thereby completely forming a drain and a source in the substrate;
forming sidewall insulators on the edges of the polysilicon electrode; and thereafter
depositing a conductive metal layer over the substrate, wherein the metal layer contacts the sidewall insulators; and
applying an anisotropic etch such that the metal layer forms metal spacers with substantially a same thickness as the polysilicon gate electrode and the gate oxide combined, wherein the metal spacers contact the sidewall insulators and first portions of the drain and the source, and second portions of the drain and the source outside the metal spacers are exposed.

21. The method of claim 20, including implanting heavily doped drain and source regions using the sidewall insulators and the polysilicon gate electrode as an implant mask before applying the high temperature anneal.

22. The method of claim 20, wherein the metal spacers provide drain and source contacts.

23. The method of claim 20, wherein the metal spacers are selected from the group consisting of aluminum, titanium, tungsten, cobalt, and combinations thereof.

24. The method of claim 20, wherein the first conductivity type is N-type, the second conductivity type is P-type, and the MOSFET is a P-channel device.

25. The method of claim 20, wherein the first conductivity type is P-type, the second conductivity type is N-type, and the MOSFET is an N-channel device.

26. A method of forming an IGFET with metal spacers, comprising the steps of:
forming a gate insulator on a semiconductor substrate;
forming a non-floating gate electrode on the gate insulator;
forming sidewall insulators adjacent to opposing edges of the gate electrode;
completely forming a drain and a source in the substrate, including applying a high-temperature anneal to drive-in and activate the drain and the source; and then
depositing a blanket layer of conductive metal over the substrate and applying an anisotropic etch to the blanket layer of conductive metal to form metal spacers that contact the sidewall insulators, contact first portions of the drain and the source and are electrically isolated from the gate electrode, wherein second portions of the drain and the source outside the metal spacers are exposed.

27. The method of claim 26, wherein the drain includes a heavily doped drain region, the source includes a heavily doped source region, the blanket layer of conductive metal is deposited on the heavily doped drain and source regions, and the metal spacers contact the heavily doped drain and source regions.

28. The method of claim 26, wherein the metal spacers have bottom surfaces substantially aligned with a bottom surface of the gate insulator.

29. The method of claim 26, wherein the metal spacers have top surfaces substantially aligned with a top surface of the gate electrode.

30. The method of claim 26, wherein the metal spacers have bottom surfaces substantially aligned with a bottom surface of the gate insulator, and the metal spacers have top surfaces substantially aligned with a top surface of the gate electrode.

31. The method of claim 26, wherein the blanket layer of conductive metal contacts substantially all of outer edges of the sidewall insulators between top and bottom surfaces of the sidewall insulators.

32. The method of claim 26, wherein the metal spacers include curved edges that are not adjacent to the sidewall insulators, the drain and the source.

33. The method of claim 26, wherein opposing edges of the gate insulator are substantially aligned with the opposing edges of the gate electrode.

34. The method of claim 26, wherein the anisotropic etch is a reactive ion etch.

35. The method of claim 26, wherein the metal spacers are aluminum.

36. The method of claim 26, wherein the metal spacers do not provide contacts for the drain and the source.

37. The method of claim 26, including forming salicide contacts on the second portions of the drain and the source after forming the metal spacers.

* * * * *